United States Patent
Murakami et al.

(10) Patent No.: US 8,735,467 B2
(45) Date of Patent: May 27, 2014

(54) PROCESS FOR PRODUCING PIGMENT-CONTAINING CURABLE RESIN SOLUTION COMPOSITION, PIGMENT DISPERSED LIQUID, AND PIGMENT-CONTAINING CURABLE RESIN SOLUTION COMPOSITION

(75) Inventors: Tooru Murakami, Ube (JP); Koji Hayashi, Usbe (JP); Seiichirou Takabayashi, Ube (JP); Nobuhiro Shigetomi, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 50 days.

(21) Appl. No.: 12/492,807

(22) Filed: Jun. 26, 2009

(65) Prior Publication Data

US 2009/0326106 A1 Dec. 31, 2009

(30) Foreign Application Priority Data

Jun. 26, 2008 (JP) ................................ 2008-167630

(51) Int. Cl.
C08L 83/00 (2006.01)
C09B 67/00 (2006.01)
(52) U.S. Cl.
USPC .............. 523/333; 524/266; 524/588; 528/26
(58) Field of Classification Search
USPC .......... 524/476, 588, 266; 528/26; 264/176.1, 264/211.21, 211.23; 523/333
See application file for complete search history.

(56) References Cited

U.S. PATENT DOCUMENTS

| 5,587,410 A * | 12/1996 | Kanalda et al. ............... 523/410 |
| 2003/0235768 A1* | 12/2003 | Fincher et al. .................... 430/7 |
| 2004/0132888 A1 | 7/2004 | Naiki et al. |
| 2006/0118001 A1* | 6/2006 | Sato et al. ..................... 106/412 |
| 2007/0134502 A1* | 6/2007 | Fonda .......................... 428/447 |
| 2007/0185286 A1* | 8/2007 | Hayashi et al. ............... 525/476 |

FOREIGN PATENT DOCUMENTS

| JP | A-S60-184205 | 9/1985 |
| JP | 7-292342 A | 11/1995 |
| JP | 9-100350 A | 4/1997 |
| JP | A-H09-184912 | 5/1997 |
| JP | 2000-297155 A | 10/2000 |
| JP | A-2002-012664 | 1/2002 |
| JP | 2004-211064 A | 7/2004 |
| JP | A-2005-113014 | 4/2005 |
| JP | A-2007-016206 | 1/2007 |

OTHER PUBLICATIONS

Office Action dated Aug. 6, 2013 in Japanese Patent Application No. 2009-151943.

* cited by examiner

*Primary Examiner* — Hannah Pak
(74) *Attorney, Agent, or Firm* — Knobbe Martens Olson & Bear LLP

(57) ABSTRACT

A process for producing a pigment-containing curable resin solution composition which comprises a pigment and a modified polysiloxane is disclosed. The process comprises the steps of: (a) preparing a pigment-dispersed liquid, wherein a pigment is dispersed in an organic solvent in the presence of a first modified polysiloxane; and (b) mixing the pigment-dispersed liquid with a resin solution which comprises at least a second modified polysiloxane. This process provides a pigment-containing curable resin solution composition with excellent dispersion stability of pigment.

10 Claims, No Drawings

PROCESS FOR PRODUCING PIGMENT-CONTAINING CURABLE RESIN SOLUTION COMPOSITION, PIGMENT DISPERSED LIQUID, AND PIGMENT-CONTAINING CURABLE RESIN SOLUTION COMPOSITION

BACKGROUND OF THE INVENTION

1. Technical Field

The present invention relates to a process for producing a pigment-containing curable resin solution composition, a pigment dispersed liquid, and the pigment-containing curable resin solution composition. This pigment-containing curable resin solution composition has excellent dispersion stability of pigment, and its cured film can be used preferably as, for example, the insulating protection film for a printed wiring board.

2. Background Art

A printed wiring board, for example, includes an insulating protection film covering circuit portions on a surface circuit patterns excluding connecting terminal portions. This insulating protection film (cured film) is usually colored green or blue. Therefore, the pigment-containing curable resin solution composition, which is obtained by dispersing pigment within a curable resin solution composition, is often used as a curable resin solution composition for the insulating protection film.

The patent documents 1 and 2 describe polyimide siloxane solution compositions as the curable resin solution composition for the insulating protection film. The patent document 1 describes that the polyimide siloxane solution composition may comprise pigment. However, no specific procedure is described how to achieve good dispersion stability of pigment in the polyimide siloxane solution composition.

The patent document 3 describes the polysiloxane modified with linear polyester comprising carbonate group or (meth)acryloyl group, and the document describes the use of the polysiloxane as an additive for irradiation curable coating. Whereas it is described that pigment may be added into the coating material, no specific procedure is described how to achieve good dispersion stability of pigment.

The patent document 4 describes polyaramid siloxane-based heat-resistant adhesive, and it is described that this modified polyimide siloxane may comprise a cross-linker and be used as a protection film. However, no specific procedure is described how to achieve good dispersion stability of pigment.

REFERENCES OF PRIOR ART

Patent Documents

Patent document 1: JP-A-2004-211064
Patent document 2: JP-A-H09-100350
Patent document 3: JP-A-2000-297155
Patent document 4: JP-A-H07-292342

SUMMARY OF THE INVENTION

If, for example, highly cohesive phthalocyanine-based pigment and the like was attempted to disperse in polyimide siloxane solution composition, which is modified polysiloxane, it was difficult to obtain the polyimide siloxane solution composition with good dispersion stability of pigment because a large amount of aggregation substances was produced.

An objective of the present invention is, therefore, to provide a process for producing the pigment-containing curable resin solution composition with excellent dispersion stability of pigment, the pigment-dispersed liquid to be preferably used in the production process, and a pigment-containing curable resin solution composition with excellent dispersion stability of pigment, in particular, a pigment-containing modified polysiloxane curable resin solution composition.

Accordingly, the present invention relates to the following items.

1. A process for producing a pigment-containing curable resin solution composition which comprises a pigment and a modified polysiloxane, the process comprising the steps of:
   (a) preparing a pigment-dispersed liquid, wherein a pigment is dispersed in an organic solvent in the presence of a first modified polysiloxane; and
   (b) mixing the pigment-dispersed liquid with a resin solution which comprises at least a second modified polysiloxane.
2. A process according to the above item 1, wherein
   the pigment-containing curable resin solution composition further comprises a curable resin component; and
   the step (b) comprises a sub-step of mixing the pigment-dispersed liquid with a resin solution which comprises the second modified polysiloxane, and a sub-step of mixing the obtained mixed liquid and the curable resin component.
3. A process according to the above item 1, wherein
   the pigment-containing curable resin solution composition further comprises a curable resin component; and
   in the step (b), the pigment-dispersed liquid is mixed with a resin solution which comprises the second modified polysiloxane and the curable resin component.
4. A pigment-dispersed liquid, wherein a pigment is dispersed in a dispersion medium comprising a modified polysiloxane and an organic solvent.
5. A pigment-dispersed liquid according to the above item 4, wherein the pigment comprises a phthalocyanine-based pigment.
6. A pigment-dispersed liquid according to the above item 4 or 5, wherein the organic solvent is selected from glymes.
7. A pigment-containing curable resin solution composition obtained by dispersing the pigment-dispersed liquid according to any one of the above items 4 to 6 in a resin solution which comprises at least a modified polysiloxane.
8. A pigment-containing curable resin solution composition according to the above item 7, wherein the modified polysiloxane is selected from polyimide siloxanes.
9. A pigment-containing curable resin solution composition according to the above item 7 or 8, wherein the composition comprises a curable resin component.
10. A cured film obtained by curing the pigment-containing curable resin solution composition according to any one of the above items 7 to 9.
11. A wiring board, wherein the cured film according to the above item 10 is formed.

According to the present invention, there is provided a process for producing a pigment-containing curable resin solution composition with excellent dispersion stability of pigment, a pigment-dispersed liquid to be preferably used in the production process, and a pigment-containing curable resin solution composition with excellent dispersion stability of pigment, in particular, a pigment-containing modified polysiloxane curable resin solution composition. The pigment-containing curable resin solution composition according to the present invention may be used preferably for, for example, the insulating protection film (cured film) of a circuit pattern on a printed wiring board.

DETAILED DESCRIPTION OF THE INVENTION

The process for producing the pigment-containing curable resin solution composition according to the present invention comprises the step (a): preparing pigment-dispersed liquid, wherein pigment is dispersed in an organic solvent in the presence of a first modified polysiloxane; and the step (b): mixing the pigment-dispersed liquid with a resin solution which comprises at least a second modified polysiloxane.

The pigment-dispersed liquid obtained by the step (a) is the composition, in which the pigment is dispersed in a dispersion medium comprising the first modified polysiloxane and the organic solvent. The pigment may be preferably selected from the conventionally-known pigments depending on the objective and application. For example, it preferably includes organic pigment such as phthalocyanine-based pigment, quinacridone-based pigment, isoindolinone-based pigment, isoindoline-based pigment, quinophthalone-based pigment, perylene-perinone-based pigment, dioxazine-based pigment, anthanthrone-based pigment, indanthrone-based pigment, vat dye-based pigment, and basic dye-based pigment, azo-based pigment such as azo pigment and condensed azo pigment, and inorganic pigment such as carbon black, titanium oxide, red oxide, iron black, iron blue, and ultramarine blue.

In the present invention, the preference is given to single use or combination of the pigments, namely green pigments, blue pigments, and yellow pigments, generally used in the known insulating protection film.

The green pigment includes, for example, chlorinated phthalocyanine green, chrome green, cobalt green, oxidized chrome green, brominated phthalocyanine green, cobalt-chrome green, titanium-nickel-cobalt-zinc-based green, and the like.

The blue pigment includes, for example, copper phthalocyanine blue (C. I. Pigment Blue 15), non-metal phthalocyanine blue (C. I. Pigment Blue 16), titanyl phthalocyanine blue, iron phthalocyanine blue, nickel phthalocyanine blue, aluminum phthalocyanine blue, tin phthalocyanine blue, alkali blue (C. I. Pigment Blue 1, 2, 3, 10, 14, 18, 19, 24, 56, 57, 61), sulfonated CuPc (C. I. Pigment Blue 17), iron blue (C. I. Pigment Blue 27), ultramarine blue (C. I. Pigment Blue 29), cobalt blue (C. I. Pigment Blue 28), sky blue (C. I. Pigment Blue 35), Co(Al, Cr)$_2$O$_4$ (C. I. Pigment Blue 36), disazo (C. I. Pigment Blue 25, 26), indanthrone (C. I. Pigment Blue 60), indigo (C. I. Pigment Blue 63, 66), cobalt phthalocyanine (C. I. Pigment Blue 75), and the like.

The yellow pigment includes, for example, monoazo yellow (C. I. Pigment Yellow 1, 4, 5, 9, 65, 74), benzimidazolone yellow (C. I. Pigment Yellow 120, 151, 175, 180, 181, 194), flavanthrone yellow (C. I. Pigment Yellow 24), azomethyl yellow (C. I. Pigment Yellow 117, 129), anthraquinone yellow (C. I. Pigment Yellow 123, 147), isoindoline yellow (C. I. Pigment Yellow 139, 185), disazo yellow (C. I. Pigment Yellow 155), fused multi-ring system (C. I. Pigment Yellow 148, 182, 192), iron oxide (C. I. Pigment Yellow 42), disazo methine (C. I. Pigment Yellow 101), azo lake (C. I. Pigment Yellow 61, 62, 100, 104, 133, 168, 169), metal complex (C. I. Pigment Yellow 150, 153, 177, 179), and the like.

The present invention is effective because it can achieve good dispersing stability even when it uses phthalocyanine-based pigment, which has particularly high cohesive property and poor dispersibility among these pigments. The phthalocyanine-based pigment means the pigment comprising chemical structure consisting of phthalocyanine or its derivatives in the pigment molecule.

The first modified polysiloxane functions as the dispersant of pigment in the pigment-dispersed liquid. That is to say, the modified polysiloxane possesses both the unit of intramolecular siloxane bond and the unit other than siloxane bond, and such structure is thought to have a function (effect) of the dispersant. While the modified polysiloxane having lower molecular weight may also be used, polymers with relatively higher molecular weight may be preferably used. In the present invention, unless particularly restricted, the terms "poly" or "polymer" are used to mean both so-called oligomers (number average molecular weight is not higher than about 10,000) and together polymers (number average molecular weight is from about 10,000 to 1,000,000).

The first modified polysiloxane specifically and preferably includes side chain-modified-type modified silicone oil such as polyether-modified silicone oil, aralkyl-modified silicone oil, fluoroaralkyl-modified silicone oil, long chain alkyl-modified silicone oil, higher fatty acid ester-modified silicone oil, higher fatty acid amide-modified silicone oil, polyether-long chain alkyl-aralkyl-modified silicone oil, and long chain alkyl-aralkyl-modified silicone oil; both-terminal-modified-type modified silicone oil such as polyether-modified silicone oil and polyether-methoxy-modified silicone oil; silicone-modified polymer such as polyimide siloxane, polyamideimide siloxane, polyamide siloxane, and polyester siloxane; and the like.

As the first modified polysiloxane, polyimide siloxane, polyamideimide siloxane, polyamide siloxane, and polyester siloxane are more preferred because they can stably function as a dispersant. The first modified polysiloxane may be identical to or different from the second modified polysiloxane, which will be described later. Generally preferred is to use the identical modified polysiloxanes due to simplicity. When the first modified polysiloxane differs from the second modified polysiloxane, two or more modified polysiloxanes exist in the final product. Therefore, the first and second modified polysiloxanes are selected in consideration of properties of the final product and the cured film obtained from the product. Moreover, both the first and second modified polysiloxanes may be a mixture of plural substances.

The organic solvent to be used in the pigment-dispersed liquid may be those capable of dissolving the first modified polysiloxane.

It specifically and preferably includes amide-based solvent such as N-methyl-2-pyrrolidinone, N,N-dimethylpropionamide, N-methyl-2-pyrrolidone, N-ethyl-2-pyrrolidone, N,N-dimethylacetamide, and N,N-dimethylformamide; cyclic ketone such as cyclohexanone and cyclopentanone; ether-based solvent such as 3-dioxane, diethylene glycol dimethyl ether, and ethylene glycol dimethyl ether; cellosolves such as ethylcellosolve and butylcellosolve; glymes such as monoglyme (for example, methylmonoglyme, ethylmonoglyme, propylmonoglyme, and butylmonoglyme), diglyme (for example, methyldiglyme, ethyldiglyme, propyldiglyme, and butyldiglyme), triglyme (for example, methyltriglyme, ethyltriglyme, propyltriglyme, and butyltriglyme), and tetraglyme (for example, methyltetraglyme and ethyltetraglyme); glycols such as ethylene glycol or diethylene glycol; acetates such as ethylcellosolve acetate, butylcellosolve acetate, and propylene glycol monomethyl ether acetate; lactone-based solvent such as γ-butyrolactone, γ-valerolactone, and δ-valerolactone, and the like.

In particular, an organic solvent selected from the group consisting of glymes such as monoglyme, diglyme, and triglyme is preferred.

If necessary, additive such as dispersing-wetting agent, antiskinning agent, ultraviolet absorber, and antioxidant may be further added to the pigment dispersed liquid according to the present invention.

The dispersion medium, which disperses pigment, comprises the first modified polysiloxane and the organic solvent, and may comprise the aforementioned additive as needed. The modified polysiloxane is preferably mixed in the ratio from 5 to 45 mass % (mass parts/100 mass parts, hereafter the same meaning is applied) in the dispersion medium (based on the total masses of the modified polysiloxane and organic solvent), preferably from 10 to 35 mass %.

The pigment is preferably mixed and dispersed in the ratio of 1 to 40 mass %, preferably 2 to 25 mass % to the dispersion medium.

Herein, the modified polysiloxane is preferably blended in a range of preferably 10 to 130 mass parts, yet preferably 25 to 100 mass parts to 100 mass parts of the pigment. The effect of the pigment dispersant is not exerted when the blending amount of the modified polysiloxane is too low whereas too much amount is not economical because the effect corresponding to the amount is not exerted.

As to the preparation of the pigment-dispersed liquid, sufficiently good effect can be achieved by simply mixing and dispersing the organic solvent, modified polysiloxane, and pigment by using known dispersing machines. The example of the dispersing machine preferably includes, but not limited to, disperser, homomixer, beads mill, ball mill, double rolls, triple rolls, press kneader, ultrasonic disperser, and the like. Among them, they are preferably mixed mechanically by kneader, roll, super mill, dry grounding processor, and the like. Alternatively, the first modified polysiloxane or the solution comprising it in the organic solvent is added to the suspension consisting of the pigment and organic solvent, and the mixing is conducted so that the modified polysiloxane is preferably deposited on (namely contacts) the pigment surface, which can achieve better result.

Although dispersing (mixing) process like this may be conducted particularly with heating, usually it may be preferably carried out at room temperature (10 to 40° C.).

The pigment-dispersed liquid thus obtained has few aggregation substances, is a uniform dispersion, and has high dispersing stability.

Next, during the step (b) in the present invention, the pigment-dispersed liquid prepared in the step (a) is mixed with the resin solution comprising at least the second modified polysiloxane.

Since the present invention comprises the step (a) and step (b), solvent shock hardly occur, and therefore the pigment-containing curable resin solution composition, which has few aggregation of pigment, uniform dispersion of pigment, and high dispersing stability, can be readily obtained. Herein, with respect to the combination of the first modified polysiloxane in the pigment-dispersed liquid and the second modified polysiloxane in the resin solution, preference is give to the use of the same type for the both (for example, combination of polyimide siloxane and polyimide siloxane, or of polyamideimide siloxane and polyamide siloxane). Particularly preferably the first modified polysiloxane in the pigment-dispersed liquid is identical to the second modified polysiloxane in the resin solution.

The resin solution, to which the pigment-dispersed liquid is mixed and dispersed, is required to comprise at least the modified polysiloxane. Other components constituting the curable resin solution composition, particularly the curable resin component, may be advantageously added and mixed at any timing, i.e. before, at the same time of, or after the mixing the pigment-dispersed liquid. Therefore, the step (b) may be defined more specifically by one of the followings (1) to (3):

(1) the step, wherein the pigment-dispersed liquid is mixed with the resin solution comprising the second modified polysiloxane (this resin solution usually comprises no curable resin component), and thereafter, the resulting mixed liquid is mixed with the curable resin component (preferably the resin solution comprising the curable resin component); or (2) the step, wherein the pigment-dispersed liquid is mixed with the resin solution comprising the second modified polysiloxane and the curable resin component; or (3) the step, wherein the pigment-dispersed liquid, the resin solution comprising the second modified polysiloxane, and the resin solution comprising the curable resin component are mixed simultaneously.

The second modified polysiloxane preferably includes polyimide siloxane, polyamideimide siloxane, polyamide siloxane, and polyester siloxane, and the like, and the mixture of these siloxanes.

The curable resin solution composition according to the present invention preferably further comprise the curable resin component. As described above, after the pigment-dispersed liquid is prepared, the curable resin component is mixed at an appropriate time and thus the pigment-containing curable resin solution composition as the final product is produced.

Examples of the curable resin component include thermosetting component such as epoxy compound (epoxy resin), phenol compound (phenol resin), and isocyanate compound (urethane resin), and the curable component curable with ultraviolet or other radiation such as compounds containing acrylic group, (meth)acrylate group, alky(meth)acrylate group, (meth)acryloyl group, and thelike.

Moreover, the organic solvent to be used in the "resin solution comprising at least the second modified polysiloxane", "resin solution comprising the second modified polysiloxane", "resin solution comprising the curable resin component", or "resin solution comprising the second modified polysiloxane and curable resin component" is the solvent dissolving the second modified polysiloxane and further the curable resin component. This solvent is preferably a solvent which can be readily mixed with the organic solvent in the pigment-dispersed liquid, and the organic solvents exemplified as the organic solvent to be used in the pigment-dispersed liquid are specifically preferred, and therefore the solvent identical to the solvent in the pigment-dispersed liquid is also very preferred.

The curable resin solution composition which comprises the second modified polysiloxane and curable component, if the time of mixing is ignored, corresponds to the components of the pigment-containing curable resin solution composition other than the pigment-dispersed liquid; and the examples thereof preferably include, but not limited to, those described, for example in the patent documents 1 to 4.

An example of the curable resin solution composition comprising the second modified polysiloxane and curable component includes the modified polysiloxane curable resin solution composition, which comprises:

(A) 100 mass parts of the organic solvent-soluble polyimide siloxane, which is obtained by the tetracarboxylic acid component, and the diamine component consisting of 30 to 95 mole % of diamino polysiloxane represented by the following general formula (1), 0.5 to 40 mole % of aromatic diamine having polar group, and 0 to 69.5 mole % of diamine other than the diamino polysiloxane or the aromatic diamine having the polar group, General formula (1):

$$H_2N-R_1-\left[Si(R_2)(R_2)-O\right]_{n1}-Si(R_2)(R_2)-R_1-NH_2 \quad (1)$$

wherein, $R_1$ denotes bivalent hydrocarbon group or aromatic group, $R_2$ independently denotes monovalent hydrocarbon group or aromatic group, and n1 denotes integer from 3 to 50;

(B) 1 to 50 mass parts of at least one curable component selected from the group consisting of epoxy compounds and polyvalent isocyanate compounds, and (C) organic solvent (specifically, the above-mentioned organic solvent).

It is preferred that the aromatic diamine having the polar group is represented by the following general formula (2):

$$H_2N-\left[\bigcirc(r1)_{n2}-X\right]_{n3}-Y-\left[X-\bigcirc(r1)_{n2}\right]_{n4}-NH_2 \quad (2)$$

wherein, X and Y denote each independently direct bond, $CH_2$, $C(CH_3)_2$, $C(CF_3)_2$, O, benzene ring, or $SO_2$, r1 denotes COOH or OH, n2 is 1 or 2, n3 and n4 are each independently 0, 1 or 2, preferably 0 or 1, and at least one of n3 and n4 is 1 or 2, and the diamine other than the diamino polysiloxane or aromatic diamine having the polar group is represented by the following general formula (3):

$$H_2N-\left[\bigcirc-X\right]_{n5}-Y-\left[X-\bigcirc\right]_{n5}-NH_2 \quad (3)$$

wherein, X and Y denote each independently direct bond, $CH_2$, $C(CH_3)_2$, $C(CF_3)_2$, O, benzene ring, or $SO_2$, and n5 is 1 or 2.

In the pigment-containing curable resin solution composition finally obtained.

based on 100 mass parts of the modified polysiloxane (the first and second modified polysiloxane), the content of the curable resin component is 1 to 100 mass parts, preferably 2 to 50 mass parts, the content of the total organic solvents is 40 to 150 mass parts, preferably 50 to 100 mass parts, and the content of the pigment is 0.1 to 15 mass parts, preferably 0.5 to 10 mass parts.

The pigment-containing curable resin solution composition according to the present invention may contain curing catalyst, and fine filler such as fine powder silica, talc, mica, and barium sulfate.

The pigment-containing curable resin solution composition is capable of forming a cured insulating film by heating at 50° C. to 210° C. after applying on a substrate.

The pigment-dispersed liquid according to the present invention may be used as a pigment-dispersed material by removing the solvent if needed, and it may be preferably used for paint, gravure ink, offset ink, plastic, color toner, and the curable resin solution composition, for example, for the insulating protection film of a printed wiring board.

The pigment-containing curable resin solution composition according to the present invention can be readily obtained without solvent shock, and it has few aggregation substances of pigment, uniform dispersion, and extremely high dispersing stability. Therefore, it can be advantageously used in a variety of applications, particularly it can be advantageously used as the curable resin solution composition, as so-called solder resist, for the insulating protection film of a printed wiring board.

In addition, since pigment is uniformly dispersed and stable, the pigment-containing curable resin solution composition according to the present invention is applied on a substrate surface, without degradation of properties, by a coating means such as screen printing, then thus-obtained coated film is preferably heated at lower temperature for removing solvent in a similar manner to compositions containing no pigment, and is subjected to a light-irradiation process at a sufficient level for light-curing reaction and/or to a heating process at heating temperature sufficiently high for effecting heat-curing reaction, whereby a cured film can be advantageously obtained.

The pigment-containing curable resin solution composition according to the present invention may be applied on the circuit portions of a surface circuit pattern excluding connecting terminal portions on a wiring board, and the coated film may be cured with light and/or heat in the above-mentioned manner, whereby the wiring board in which the circuit pattern is advantageously insulated and protected with the cured film of the curable resin solution composition can be obtained.

EXAMPLES

Hereafter, the present invention is further explained by examples. However, the present invention is not restricted by the following examples.

The materials used in the following each example are explained.

<Epoxy Compound> jER 828: epoxy resin made by Japan Epoxy Resins Co., Ltd.

jER 157S70: epoxy resin made by Japan Epoxy Resins Co., Ltd.

<Polyvalent Isocyanate Compound>

Burnock D-550: 1,6-hexamethylene diisocyanate blocked compound made by DIC Co., blocking agent: methylethylketoxime <Phenol Resin>

MEH-7851: phenol resin made by Meiwa Plastic Industries Ltd.

<Defoaming Agent>

KS 531: silicone defoaming agent made by Shin-Etsu Chemical Co., Ltd. (self-emulsifying compound-type silicone defoaming agent, which contains, in a compound of dimethyl polysiloxane and silica, the polysiloxane as an emulsifier in which the substituent groups of siloxane backbone consist of about 10% of polyoxyalkylene group and about 90% of methyl group)

<Curing Catalyst>

2E4MZ: 2-ethyl-4-methylimidazole made by Shikoku Chemicals Co.

DBU: 1,8-diazabicyclo[5.4.0]-7-undecene made by Aldrich Co.

<Inorganic Filler>

Aerosil #50: made by Nippon Aerosil Co., Ltd., average particle size: 30 nm

Aerosil #130: made by Nippon Aerosil Co., Ltd., average particle size: 16 nm

Talc P-3. Talc, Micro Ace P-3 made by Nippon Talc Co., Ltd., average particle size: 5.1 μm Barium sulfate B-30: barium sulfate made by Sakai Chemical Industry Co., Ltd., average particle size: 0.3 μm <Pigment>

The product names, producing companies, C. I. Generic names, and classifications of the used pigments are below.

Seikafast yellow 10GH conc.: made by Dainichiseika Color & Chemicals Mfg.Co., Ltd., Y-3, monoazo yellow Cyanine blue HS-3: made by Dainichiseika Color & Chemicals Mfg.Co., Ltd., B-15, phthalocyanine blue Cyanine green 2GN: made by Dainichiseika Color & Chemicals Mfg.Co., Ltd., G-7, phthalocyanine green <Pigment Dispersant>

Disparlon KS-260: made by Kusumoto Chemicals, Ltd., the mixture of amine salt of ester acid and silicone (modified with both acid and base)

Disparlon 1210: made by Kusumoto Chemicals, Ltd., aliphatic-based polyvalent carboxylic acid (acid group terminal)

Disparlon DA 1401: made by Kusumoto Chemicals, Ltd., specialty-modified polyamide (basic group terminal)

The evaluating methods of the following examples are below.

<Rotational Viscosity>

It was measured by an E-type viscometer (made by Tokyo Keiki Inc.) with ST rotor at 25° C.

<Inherent Viscosity ($\eta$inh)>

Solution in which polymer is uniformly dissolved in N-methyl-2-pyrrolidone so that its concentration becomes 0.5 g/100 ml of solvent was prepared, and the solution viscosities of its solution and solvent were measured at 30° C. and the inherent viscosity was calculated by the following equation.

Inherent viscosity($\eta_{inh}$)={ln(Solution viscosity/solvent viscosity)}/Concentration of solution (wherein, ln denotes natural logarithm.)

<Dispersing Stability>

Increase in Viscosity After One Month

The ratio of the rotational viscosity after storage of thirty days to the rotational viscosity after storage of one day at 25° C. was determined. When it is within −2% to +2%, it is indicated as "non". When it is −2% or smaller, or +2% or larger, it is indicated as "changed".

Existence or Nonexistence of Re-Aggregation (After One Day, After Seven Days)

One drop of the pigment-dispersed liquid after storage of one day or seven days at 25° C. is dropped on a slide glass by a dropper, and a cover glass is placed, which is then observed by a microscope (40 times power). When there are aggregation substances with 10 μm or larger, it is indicated as "exist". In case there is no such substance, it is indicated as "non".

Re-Aggregation After Mixing

A given amount of the pigment-dispersed liquid is added to a polymer solution with 50 mass % of solid, and it is stirred by using a three-one motor at 200 rpm for 30 minuets. One drop of the obtained mixture is dropped on a slide glass by a dropper, and a cover glass is placed, which is then observed by a microscope (40 times power). When there are aggregation substances with 10 μm or larger, it is indicated as "exist". In case there is no such substance, it is indicated as "non".

<Defoaming Property of Coated Film>

For evaluating the defoaming property of coated film, a square (filled square) of 1 cm×1 cm size was screen-printed manually on a polyimide film (Upilex 25S) by using a screen mask (SUS, 180 mesh, emulsion thickness 15 μm, mesh thickness 101 μm) with a squeegee (hardness: 70, material: silicone rubber), and time was measured until all foams disappear by observing through an optical microscope with 10 times power under transmission light. The measurement was carried out three times, and the defoaming time was determined by their mean value.

The evaluation result of the defoaming property is indicted by "good" when the time all foams disappear is 150 seconds or shorter, "moderate" for 150 seconds to 200 seconds, and "bad" for 200 seconds or longer.

Referential Example 1

To a glass flask with a volume of 500 ml, 47.1 g (0.16 mole) of 2,3,3',4'-biphenyltetracarboxylic dianhydride and 100 g of methyltriglyme (hereafter, may be called just triglyme for short, or may be abbreviated as TG) as solvent were fed, and stirred at 180° C. under a nitrogen atmosphere. To this solution, 125.1 g (0.136 mole) of α,ω-bis(3-aminopropyl)polydimethylsiloxane (amino equivalent 460) and 40 g of TG were added, and stirred and reacted at 180° C. for 60 minutes. 6.9 g (0.024 mole) of 3,3'-carboxy-4,4'-diaminodiphenylmethane (MBAA) and 39 g of TG were further added to this reaction solution, and stirred and reacted at 180° C. for 10 hours. The resulting reaction mixture was filtered to give the solution of 50 mass % of polyimide siloxane in the triglyme, which has an inherent viscosity ($\eta$inh) of 0.20. The imidization rate {i.e. ratio (%) of imidization} of this polyimide siloxane, which is determined by infrared absorption spectrum, was virtually 100%.

Referential Example 2

To a glass flask with a volume of 500 ml, 47.1 g (0.16 mole) of 2,3,3',4'-biphenyltetracarboxylic dianhydride and 100 g of methyltriglyme as solvent were fed, and stirred with heat at 180° C. under a nitrogen atmosphere. To this solution, 92.9 g (0.101 mole) of α,ω-bis(3-aminopropyl)polydimethylsiloxane (amino equivalent 460) and 40 g of TG were added, and stirred and reacted at 180° C. for 60 minutes. 6.3 g (0.022 mole) of 3,3'-carboxy-4,4'-diaminodiphenylmethane (MBAA), 15.0 g (0.037 mole) of 2,2-bis[4-(4-aminophenoxy)phenyl]propane (BAPP) and 10 g of TG were further added to this reaction solution, and stirred and reacted at 180° C. for 10 hours. The resulting reaction mixture was filtered to give the solution of 50 mass % of polyimide siloxane in the triglyme, which has an inherent viscosity ($\eta$inh) of 0.20. The imidization rate {i.e. ratio (%) of imidization} of this polyimide siloxane, which is determined by infrared absorption spectrum, was virtually 100%.

The polyimide siloxanes obtained through the referential example 1 and the referential example 2 were used for both the pigment-dispersed liquid (A) and the pigment-containing curable resin solution composition (C), and the following experiments were carried out.

Example 1

Pigment-Dispersed Liquid (A)

20 mass parts of the solution of 50 mass % of polyimide siloxane in the triglyme, which was obtained in the referential example 1, was added to 70 mass parts of the triglyme of organic solvent, and they were mixed and uniformly dissolved. To this solution, 10 mass parts of pigment, Seikafast yellow 10GH conc., was added. This mixed dispersion liquid was processed for dispersion for 60 minuets by a beads mill, and then filtrated with a 5 μm filter to obtain the pigment-dispersed liquid (A).

The obtained pigment-dispersed liquid (A) was allowed to stand at 25° C. and observed. It was found, there was no re-aggregation in the dispersion solution after one day or after seven days and there was no change in viscosity after one month.

Mixed Liquid (B)

15 mass parts of the pigment-dispersed liquid (A) was added to 100 mass parts of the solution of 50 mass % of polyimide siloxane in the triglyme, which was obtained in the referential example 1, and they were stirred at 1,000 rpm by using a homomixer to obtain mixed liquid (B), which is uniformly colored without re-aggregation substances.

Pigment-Containing Curable Resin Solution Composition (C)

40.0 g of the colored mixed liquid (B), 3.7 g (9.25 mass parts, based on 100 mass parts of the colored mixed liquid (B), hereinafter the same meaning applies) of an epoxy resin jER 828, 0.1 g (0.25 mass parts) of a curing catalyst 2E4MZ, 0.9 g (2.25 mass parts) of a silicone-based defoaming agent KS 531, 3.9 g (9.75 mass parts) of an inorganic filler Aerosil 50, 4.8 g (12.0 mass parts) of talc Micro Ace P-3, and 14.5 g (36.25 mass parts) of barium sulfate B-30 were fed into a glass vessel, and stirred and mixed at 25° C. for 2 hours to obtain the uniform pigment-containing curable resin solution composition (C)

The solution viscosity of this pigment-containing curable resin solution composition (C) was 250 poises, and the time foams disappeared was 120 seconds by the evaluation of the defoaming at 25° C. and 60% RH.

The table 1 shows the results.

Examples 2 to 14

In a similar manner to the example 1 except that the formulation in the pigment-dispersed liquids was modified as shown in the table 1, the pigment-dispersed liquids (A) and the pigment-containing curable resin solution compositions (C) were obtained. The table 1 shows the results.

Example 15

Pigment-Dispersed Liquid (A)

45 mass parts of the solution of 50 mass % of polyimide siloxane in the triglyme, which was obtained in the referential example 2, was added to 35 mass parts of the triglyme of organic solvent, and they were mixed and uniformly dissolved. To this solution, 20 mass parts of pigment, Seikafast yellow 10GH conc., was added. This mixed dispersion liquid was processed for dispersion for 60 minuets by a beads mill, and then filtrated with a 5 μm filter to obtain the pigment-dispersed liquid (A).

The obtained pigment-dispersed liquid (A) was allowed to stand at 25° C. and observed. It was found, there was no re-aggregation in the dispersion solution after one day or after seven days and there was no change in viscosity after one month.

Mixed Liquid (B)

2.0 mass parts of the pigment-dispersed liquid (A) was added to 100 mass parts of the solution of 50 mass % of polyimide siloxane in the triglyme, which was obtained in the referential example 2, and they were stirred at 1,000 rpm by using a homomixer to obtain mixed liquid (B), which is uniformly colored without re-aggregation substances.

Pigment-Containing Curable Resin Solution Composition (C)

40.0 g of the colored mixed liquid (B), 0.36 g (0.9 mass parts, based on 100 mass parts of the colored mixed liquid (B), hereinafter the same meaning applies) of an epoxy resin jER 157S, 2.1 g (5.25 mass parts) of a polyvalent isocyanate D-550, 1.28 g (3.2 mass parts) of a phenol resin MEH-7851, 0.168 g (0.42 mass parts) of DBU and 0.042 g (0.105 mass parts) of 2E4MZ as curing catalysts, 2.37 g (5.925 mass parts) of a silicone-based defoaming agent KS 531, 3.96 g (9.9 mass parts) of inorganic filler Aerosil 50 and 1.98 g (4.95 mass parts) of inorganic filler Aerosil 130, 7.42 g (18.6 mass parts) of talc Micro Ace P-3, and 4.95 g (12.4 mass parts) of barium sulfate B-30 were fed into a glass vessel, and stirred and mixed at 25° C. for 2 hours to obtain the uniform pigment-containing curable resin solution composition (C).

The solution viscosity of this pigment-containing curable resin solution composition (C) was 290 poises, and the time foams disappeared was 120 seconds by the evaluation of the defoaming at 25° C. and 60% RH.

The table 1 shows the results.

Examples 16 to 17

In a similar manner to the example 1 except that the formulation in the pigment-dispersed liquids was modified as shown in the table 1, the pigment-dispersed liquids (A) and the pigment-containing curable resin solution compositions (C) were obtained. The table 1 shows the results.

Example 18

In the examples 1 to 17 mentioned above, the pigment-dispersed liquid (A), the mixed liquid (B) and the pigment-containing curable resin solution composition (C) were sequentially prepared. In the example 18, the preparation of the mixed liquid (B) in the above-mentioned examples was omitted. Alternatively, in the preparation of the pigment-containing curable resin solution composition (C), the solution of polyimide siloxane in the triglyme was mixed with other components in advance to obtain a mixed liquid. To this mixed liquid, the pigment-dispersed liquid (A) was fed into this mixed liquid, and stirred and mixed at 25° C. for 2 hours to obtain the uniform pigment-containing curable resin solution composition (C). The substances and amounts of components in the composition (C) were determined to be identical to each example. The obtained pigment-containing curable resin solution compositions (C) exhibited the same properties as those of the examples 1 to 17.

Comparative Examples 1 to 20

In a similar manner to the example 1 except that the formulation in the pigment-dispersed liquids was modified as shown in the table 1, the pigment-dispersed liquids (A), the mixed liquids (B) and the pigment-containing curable resin solution compositions (C) were obtained. The table 2 shows the results.

TABLE 1

| | Examples | | | | | | | | | | | | | | | | |
|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 |
| Pigment-dispersed liquid (A) | | | | | | | | | | | | | | | | | |
| Triglyme | 70 | 70 | 70 | 70 | 55 | 55 | 55 | 40 | 40 | 40 | 40 | 50 | 50 | 50 | 35 | 35 | 35 |
| Referential example 1 (polyimide siloxane solution (50 mass %)) | 20 | 20 | 20 | 20 | 30 | 30 | 30 | 40 | 40 | 40 | 40 | 30 | 30 | 30 | | | |
| Referential example 2 (polyimide siloxane solution (50 mass %)) | | | | | | | | | | | | | | | 45 | 45 | 45 |
| Pigment | | | | | | | | | | | | | | | | | |
| Seikafast yellow 10GH conc. (yellow) | 10 | | | 4 | 15 | | | 20 | | | | 8 | 20 | | 20 | | |
| Cyanine blue HS-3 (blue) | | 10 | | | | 15 | | | 20 | | | | | 20 | | 20 | |
| Cyanine green 2GN (green) | | | 10 | 6 | | | 15 | | | 20 | 20 | 12 | | | | | 20 |
| Pigment dispersant | | | | | | | | | | | | | | | | | |
| Disparlon KS-260 (modified with both acid and base) | | | | | | | | | | | | | | | | | |
| Disparlon 1210 (acid group terminal) | | | | | | | | | | | | | | | | | |
| Disparlon DA 1401 (basic group terminal) | | | | | | | | | | | | | | | | | |
| Existence of re-aggregation (after 1 day) | Non | Non | Non | Non | Non | Non | Non | Non | Non | Non | Non | Non | Non | Non | Non | Non | Non |
| Existence of re-aggregation (after 7 days) | Non | Non | Non | Non | Non | Non | Non | Non | Non | Non | Non | Non | Non | Non | Non | Non | Non |
| Increase in viscosity after 1 month | Non | Non | Non | Non | Non | Non | Non | Non | Non | Non | Non | Non | Non | Non | Non | Non | Non |
| Mixed liquid (B) | | | | | | | | | | | | | | | | | |
| Referential example 1 (polyimide siloxane solution (50 mass %)) | 100 | 100 | 100 | 100 | 100 | 100 | 100 | 100 | 100 | 100 | 100 | 100 | 100 | 100 | 100 | 100 | 100 |
| Pigment-dispersed liquid (A) | 15 | 15 | 15 | 15 | 15 | 15 | 15 | 15 | 15 | 15 | 15 | 15 | 15 | 15 | 2 | 2 | 2 |
| Re-aggregation after mixing | Non | Non | Non | Non | Non | Non | Non | Non | Non | Non | Non | Non | Non | Non | Non | Non | Non |
| Pigment-containing curable resin solution composition (C) | | | | | | | | | | | | | | | | | |
| Rotational viscosity [Poise] (10 rpm, 30° C.) | 250 | 250 | 250 | 250 | 245 | 245 | 245 | 255 | 255 | 255 | 255 | 260 | 260 | 260 | 290 | 290 | 290 |
| Defoaming property of coated film | Good | Good | Good | Good | Good | Good | Good | Good | Good | Good | Good | Good | Good | Good | Good | Good | Good |

TABLE 2

| | Comparative examples | | | | | | | | | | |
|---|---|---|---|---|---|---|---|---|---|---|---|
| | 1 | 2 | 3 | 4 | 5 | 6 | 7 | 8 | 9 | 10 | 11 |
| Pigment-dispersed liquid (A) | | | | | | | | | | | |
| Triglyme | 90 | 90 | 90 | 85 | 85 | 85 | 85 | 85 | 85 | 85 | 85 |
| Pigment | | | | | | | | | | | |
| Seikafast yellow 10GH conc. (yellow) | 10 | | | 10 | | | 10 | | | 4 | 10 |
| Cyanine blue HS-3 (blue) | | 10 | | | 10 | | | 10 | | | 10 |
| Cyanine green 2GN (green) | | | 10 | | | 10 | | | 10 | 6 | |
| Pigment dispersant | | | | | | | | | | | |
| Disparlon KS-260 | | | | 5 | 5 | 5 | | | | | |
| Disparlon 1210 | | | | | | | | | | | 5 |
| Disparlon DA 1401 | | | | | | | 5 | 5 | 5 | 5 | |
| Existence of re-aggregation (after 1 day) | Non | Non | Non | Non | Non | Non | Non | Non | Non | Non | Exist |

TABLE 2-continued

| | | | | | | | | | | | |
|---|---|---|---|---|---|---|---|---|---|---|---|
| Existence of re-aggregation (after 7 days) | Exist | Exist | Exist | Non | Non | Non | Non | Non | Non | Non | — |
| Increase in viscosity after 1 month | Changed | Changed | Changed | Changed | Changed | Changed | Non | Non | Non | Non | — |
| Mixed liquid (B) | | | | | | | | | | | |
| Referential example 1 (polyimide siloxane solution (50 mass %)) | 100 | 100 | 100 | 100 | 100 | 100 | 100 | 100 | 100 | 100 | 100 |
| Pigment-dispersed liquid (A) | 15 | 15 | 15 | 15 | 15 | 15 | 15 | 15 | 15 | 15 | 15 |
| Re-aggregation after mixing | Exist | Exist | Exist | Exist | Exist | Exist | Exist | Exist | Exist | Exist | — |
| Pigment-containing curable resin solution composition (C) | | | | | | | | | | | |
| Rotational viscosity [Poise] (10 rpm, 30° C.) | 240 | 240 | 240 | 245 | 245 | 245 | 255 | 255 | 255 | 255 | 265 |
| Defoaming property of coated film | Good | Good | Good | Bad | Bad | Bad | Bad | Bad | Bad | Bad | Bad |

| | Comparative examples | | | | | | | | |
|---|---|---|---|---|---|---|---|---|---|
| | 12 | 13 | 14 | 15 | 16 | 17 | 18 | 19 | 20 |
| Pigment-dispersed liquid (A) | | | | | | | | | |
| Triglyme | 85 | 85 | 75 | 75 | 75 | 75 | 75 | 75 | 75 |
| Pigment | | | | | | | | | |
| Seikafast yellow 10GH conc. (yellow) | | 15 | | | 20 | | | 8 | |
| Cyanine blue HS-3 (blue) | | | 15 | | | 20 | | | |
| Cyanine green 2GN (green) | 10 | | | 15 | | | 20 | 12 | |
| Pigment dispersant | | | | | | | | | |
| Disparlon KS-260 | | | | | | | | | |
| Disparlon 1210 | 5 | 5 | | | | | | | |
| Disparlon DA 1401 | | 10 | 10 | 10 | 5 | 5 | 5 | 5 | |
| Existence of re-aggregation (after 1 day) | Exist | Exist | Non | Non | Non | Exist | Exist | Exist | Exist |
| Existence of re-aggregation (after 7 days) | — | — | Exist | Exist | Exist | Exist | Exist | Exist | Exist |
| Increase in viscosity after 1 month | — | — | Changed | Changed | Changed | Changed | Changed | Changed | Changed |
| Mixed liquid (B) | | | | | | | | | |
| Referential example 1 (polyimide siloxane solution (50 mass %)) | 100 | 100 | 100 | 100 | 100 | 100 | 100 | 100 | 100 |
| Pigment-dispersed liquid (A) | 15 | 15 | 15 | 15 | 15 | 15 | 15 | 15 | 15 |
| Re-aggregation after mixing | — | — | — | — | — | — | — | — | — |
| Pigment-containing curable resin solution composition (C) | | | | | | | | | |
| Rotational viscosity [Poise] (10 rpm, 30° C.) | 265 | 265 | 260 | 260 | 260 | 270 | 270 | 270 | 270 |
| Defoaming property of coated film | Bad | Bad | Bad | Bad | Bad | Bad | Bad | Bad | Bad |

INDUSTRIAL APPLICABILITY

According to the present invention, the process for producing the pigment-containing curable resin solution composition with excellent dispersion stability of pigment, the pigment-dispersed liquid to be used advantageously in the production process, and the pigment-containing curable resin solution composition with excellent dispersion stability of pigment, in particular, the pigment-containing modified polysiloxane curable resin solution composition can be obtained.

What is claimed is:

1. A process for producing a pigment-containing curable resin solution composition which comprises a pigment and a modified polysiloxane, the process comprising the steps of:
    (a) preparing a pigment-dispersed liquid, wherein a pigment is dispersed in a dispersion medium consisting essentially of an organic solvent and a first modified polysiloxane dissolved in the organic solvent; and
    (b) mixing the pigment-dispersed liquid with a resin solution which comprises at least a second modified polysiloxane,
    wherein the pigment-dispersed liquid exhibits a change of rotational viscosity within −2% to +2% after storage of thirty days at 25° C. based on a rotational viscosity after storage of one day at 25° C., and exhibits no occurrence of aggregation after storage of one day and seven days at 25° C. when observed by a microscope with magnifying ink 40 times.

2. The process according to claim 1, wherein
the pigment-containing curable resin solution composition further comprises a curable resin component; and
the step (b) comprises a sub-step of mixing the pigment-dispersed liquid with a resin solution which comprises the second modified polysiloxane, and a sub-step of mixing the obtained mixed liquid and the curable resin component.

3. The process according to claim 1, wherein
the pigment-containing curable resin solution composition further comprises a curable resin component; and
in the step (b), the pigment-dispersed liquid is mixed with a resin solution which comprises the second modified polysiloxane and the curable resin component.

4. A pigment-dispersed liquid, wherein a pigment is dispersed in a dispersion medium consisting essentially of an organic solvent and a modified polysiloxane dissolved in the organic solvent,
wherein the pigment-dispersed liquid exhibits a change of rotational viscosity within −2% to +2% after storage of thirty days at 25° C. based on a rotational viscosity after storage of one day at 25° C., and exhibits no occurrence of aggregation after storage of one day and seven days at 25° C. when observed by a microscope with magnifying 40 times.

5. The pigment-dispersed liquid according to claim 4, wherein the pigment comprises a phthalocyanine-based pigment.

6. The pigment-dispersed liquid according to claim 4, wherein the organic solvent is selected from glymes.

7. A process for producing a cured film, comprising a step of curing the pigment-containing curable resin solution composition that is formed according to claim 3.

8. A process for producing a cured film, comprising a step of curing the pigment-dispersed liquid that is formed according to claim 4.

9. A process for producing a wiring board, comprising a step of curing the pigment-containing curable resin solution composition that is formed according to claim 3.

10. A process for producing a wiring board, comprising a step of curing the pigment-dispersed liquid that is formed according to claim 4.

* * * * *

UNITED STATES PATENT AND TRADEMARK OFFICE
CERTIFICATE OF CORRECTION

PATENT NO. : 8,735,467 B2
APPLICATION NO. : 12/492807
DATED : May 27, 2014
INVENTOR(S) : Murakami et al.

It is certified that error appears in the above-identified patent and that said Letters Patent is hereby corrected as shown below:

In the Specification

Column 5, Line 53, delete "give" and insert --given--.

Column 6, Line 32, delete "thelike." and insert --the like.--.

Column 9, Line 66, delete "minuets." and insert --minutes.--.

Column 11, Line 5, delete "minuets" and insert --minutes--.

Column 11, Line 37, delete "(C)" and insert --(C).--.

Column 11, Line 63, delete "minuets" and insert --minutes--.

In the Claims

Column 16, Line 62, Claim 1, delete "magnifying ink" and insert --magnifying--.

Signed and Sealed this
Twenty-fifth Day of November, 2014

Michelle K. Lee
*Deputy Director of the United States Patent and Trademark Office*